United States Patent [19]

Kishimoto et al.

[11] Patent Number: 5,006,199

[45] Date of Patent: Apr. 9, 1991

[54] PROCESS FOR PREPARING SINGLE CRYSTAL OF POTASSIUM TITANIUM ARSENATE

[75] Inventors: Toshiki Kishimoto, Mitaka; Kuniyasu Imamura, Oume, both of Japan

[73] Assignee: Sumitomo Metal Mining Company Limited, Tokyo, Japan

[21] Appl. No.: 541,538

[22] Filed: Jun. 21, 1990

[30] Foreign Application Priority Data

Jul. 28, 1989 [JP] Japan .................................. 1-193947

[51] Int. Cl.$^5$ ............................................... C30B 9/04
[52] U.S. Cl. ................................ 156/621; 156/623 R; 156/624; 156/DIG. 71; 156/DIG. 75
[58] Field of Search .................. 156/621, 623 R, 624, 156/DIG. 71, DIG. 75, DIG. 81

[56] References Cited

U.S. PATENT DOCUMENTS

| | | | |
|---|---|---|---|
| 3,341,302 | 9/1967 | Flanigen et al. | 156/623 R |
| 3,949,323 | 4/1976 | Bierlein et al. | 156/DIG. 71 |
| 4,231,838 | 11/1980 | Gier | 156/DIG. 105 |
| 4,305,778 | 12/1981 | Gier | 156/DIG. 75 |
| 4,746,396 | 5/1988 | Marnier | 156/DIG. 71 |
| 4,761,202 | 8/1988 | Bordui et al. | 156/DIG. 71 |

FOREIGN PATENT DOCUMENTS 2200622A 8/1988 United Kingdom ............... 156/624

Primary Examiner—Olik Chaudhuri
Assistant Examiner—Felisa Garret-Meza
Attorney, Agent, or Firm—Watson, Cole, Grindle & Watson

[57] ABSTRACT

Disclosed is a process for preparing a single crystal of potassium titanium arsenate by flux growth method, wherein a compound of $K_2ZO_4$, in which Z is at least one of W, S, Mo and Cr, is used as a flux and the flux is blended with potassium titanium arsenate in such a way that the proportion of potassium titanium arsenate is from 15 to 50 mol % of the whole. The process may be carried out by conventional flux growth method under an atmospheric pressure and gives a single crystal of potassium titanium arsenate at a low cost.

3 Claims, No Drawings

PROCESS FOR PREPARING SINGLE CRYSTAL OF POTASSIUM TITANIUM ARSENATE

FIELD OF THE INVENTION

The present invention relates to a process for preparing a single crystal of potassium titanium arsenate, which has a function of modulating an infrared YAG laser ray into a green ray with a high conversion efficiency.

BACKGROUND OF THE INVENTION

It is known that a single crystal of potassium titanium phosphate, which has the same crystal structure as that of potassium titanium arsenate, is able to convert an infrared YAG laser ray into a green ray and that the conversion efficiency is high. Recently, it has been found that the conversion efficiency of a single crystal of potassium titanium arsenate is higher than that of a single crystal of potassium titanium phosphate and therefore the former single crystal is widely noticed by those skilled in the art.

A single crystal of potassium titanium arsenate ($KTiOAsO_4$) is manufactured by hydrothermal synthesis method under severe conditions of a temperature of from 500° to 700° C. and a pressure of 3000 atm or so. This is because if $KTiOAsO_4$ is directly heated up to a high temperature, it would decompose and the arsenic acid radical would be evaporated out therefrom and, as a result, the chemical composition of the crystal to be obtained would be varied. Therefore, a single crystal of $KTiOAsO_4$ is inevitably high-priced so that it is not utilized industrially at all despite of the extremely excellent characteristic thereof.

SUMMARY OF THE INVENTION

The object of the present invention is to provide a process for preparing a low-priced single crystal of $KTiOAsO_4$ in order that the single crystal thereof can be utilized industrially.

In order to attain the object, there is provided in accordance with the present invention a process for preparing a single crystal of potassium titanium arsenate by flux growth method, wherein a compound of $K_2ZO_4$, in which Z is at least one selected from the group consisting of W, S, Mo and Cr, is used as a flux and the said flux is blended with potassium titanium arsenate in such a way that the proportion of potassium titanium arsenate is from 15 to 50 mol % of the whole.

DETAILED DESCRIPTION OF THE INVENTION

In the present invention, the object of employing the flux is to lower the melting point of $KTiOAsO_4$ in order that $KTiOAsO_4$ may be uniformly melted under an atmospheric condition to prevent decomposition of $KTiOAsO_4$ to cause evaporation of arsenic acid radical therefrom whereby the composition of the crystal to be formed is maintained to be constant. The flux to be used in the present invention for the purpose is $K_2ZO_4$, in which Z is at least one selected from the group consisting of W, S, Mo and Cr.

On the other hand, $KTiOAsO_4$ to be employed in the present invention is one obtained by blending $KAsO_3$ or $KH_2AsO_4$ and $TiO_2$ in the same molar ratio and roasting them.

Regarding the proportion in blending $KTiOAsO_4$ and the flux in the process of the present invention, if the ratio of $KTiOAsO_4$ is too small, the manufacture efficiency of forming the intended single crystal would lower, but if it is too large, the temperature for uniformly blending $KTiOAsO_4$ would rise so that $KTiOAsO_4$ would thereby be decomposed to cause evaporation of arsenic acid radical therefrom. As a result, the composition of the crystal to be obtained would be disordered and preparation of a good single crystal of $KTiOAsO_4$ would become difficult. On these grounds, the proportion of $KTiOAsO_4$ to the flux must be so defined that the ratio of $KTiOAsO_4$ to the whole is from 15 to 50 mol %.

One preferred embodiment of the present invention will be mentioned below.

About 80 ml of a raw material mixture comprising $KTiOAsO_4$ and $K_2SO_4$ in a molar ratio of $KTiOAsO_4/K_2SO_4$ of being 3/7 was put in a crucible as set in a single crystal growth device composed of a 100 ml-platinum crucible and a temperature programmer-combined electric furnace, and this was heated at a temperature elevating speed of 100° C./hr until the whole was uniformly melted. Next, the thus melted material was further heated until the capacity of the thus melted material became about 80 ml, whereupon the temperature of the melted material was 1000° C. Next, this was kept at 1000° C. for 10 hours and then cooled to 500° C. at a cooling speed of 1° C./hr. Afterwards, this was allowed to be further cooled to room temperature and then the product was put into water along with the crucible and the single crystal of $KTiOAsO_4$ as precipitated out was recovered. The single crystal thus obtained was in the form of granules having a grain size of 3 mm. The conversion efficiency of the single crystal for converting an infrared YAG laser ray to a green ray was extremely high.

As is noted from the above-mentioned embodiment, the present invention may use the same device and means as those for a conventional flux growth method and may form a single crystal of $KTiOAsO_4$ inexpensively and easily under an atmospheric condition.

The following examples are intended to illustrate the present invention in more detail but not to restrict it in any way.

EXAMPLE 1

About 80 ml of a raw material mixture prepared by blending $KTiOASO_4$ and $K_2WO_4$ in a proportion of $KTiOAsO_4$ of being 15, 20, 30, 40 or 50 mol % was put in a crucible as set in a single crystal growth device composed of a 100 ml-platinum crucible and a temperature programmer-combined electric furnace, and this was heated at a temperature-elevating speed of 100° C./hr until the whole was uniformly melted. Next, the thus melted material was further heated until the capacity of the thus melted material became about 80 ml, then this was kept at the elevated temperature for further 10 hours, and thereafter this was cooled to 500° C. at a cooling speed of 2° C./hr. Next, this was allowed to be further cooled to room temperature and then the product was put into water along with the crucible and the single crystal of $KTiOAsO_4$ as precipitated out was recovered. The single crystal thus obtained was in the form of granules having a grain size of from 2.5 to 6 mm. The conversion efficiency of the single crystal for converting an infrared YAG laser ray to a green ray was extremely high. The temperature of the melted material was 900°, 950°, 1000°, 1050° or 1100° C.

EXAMPLE 2

About 80 ml of a raw material mixture prepared by blending $KTiOAsO_4$ and $K_2CrO_4$ in a proportion of $KTiOAsO_4$ of being 30 mol % was put in a crucible as set in a single crystal growth device composed of a 100 ml-platinum crucible and a temperature programmer-combined electric furnace, and this was heated at temperature-elevating speed of 100° C./hr until the whole was uniformly melted. Next, the thus melted material was further heated until the capacity of the thus melted material became about 80 ml, then this was kept at the elevated temperature for further 10 hours, and thereafter this was cooled to 500° C. at a cooling speed of 2° C./hr. Next, this was allowed to be further cooled to room temperature and then the product was put into water along with the crucible and the single crystal of $KTiOAsO_4$ as precipitated out was recovered. The single crystal thus obtained was in the form of granules having a grain size of 3.5 mm. The conversion efficiency of the single crystal for converting an infrared YAG laser ray to a green ray was extremely high. The temperature of the melted material was 1000° C.

EXAMPLE 3

About 80 ml of a raw material mixture prepared by blending $KTiOAsO_4$ and $K_2MnO_4$ in a proportion of $KTiOAsO_4$ of being 30 mol % was put in a crucible as set in a single crystal growth device composed of a 100 ml-platinum crucible and a temperature programmer-combined electric furnace, and this was heated at a temperature-elevating speed of 100° C./hr until the whole was uniformly melted. Next, the thus melted material was further heated until the capacity of the thus melted material became about 80 ml, then this was kept at the elevated temperature for further 10 hours, and thereafter this was cooled to 500° C. at a cooling speed of 2° C./hr. Next, this was allowed to be further cooled to room temperature and then the product was put into water along with the crucible and the single crystal of $KTiOAsO_4$, as precipitated out was recovered. The single crystal thus obtained was in the form of granules having a grain size of 3.5 mm. The conversion efficiency of the single crystal for converting an infrared YAG laser ray to a green ray was extremely high. The temperature of the melted material was 1000° C.

COMPARATIVE EXAMPLE

About 80 ml of a raw material mixture prepared by blending $KTiOAsO_4$ and $K_2WO_4$, $KTiOAsO_4$ and $K_2SO_4$, $KTiOASO_4$ and $K_2CrO_4$, or $KTiOAsO_4$ and $K_2MnO_4$ each in a proportion of $KTiOAsO_4$ of being 60 mol % was put in a crucible as set in a single crystal growth device composed of a 100 ml-platinum crucible and a temperature programmer-combined electric furnace, and this was heated at a temperature-elevating speed of 100° C./hr until the whole was uniformly melted. Next, the thus melted material was further heated until the capacity of the thus melted material became about 80 ml, then this was kept at the elevated temperature for further 10 hours, and thereafter this was cooled to 500° C. at a cooling speed of 2° C./hr. Next, this was allowed to be further cooled to room temperature and then the product was put into water along with the crucible and the single crystal of $KTiOAsO_4$ as precipitated out was recovered. All the crystals obtained were opaque. This is because the temperature for uniformly melting the blend was too high and therefore the arsenic acid radical evaporated out. As a result, the excess K or Ti was trapped in the inside of the crystal formed.

As is obvious from the results in the above-mentioned examples and comparative example, the raw material mixture containing a flux in a defined range may have a melting temperature at which arsenic acid does not evaporate out from the mixture. Therefore, in accordance with the process of the present invention, a single crystal of $KTiOAsO_4$ may be obtained by a simple operation to be effected under an atmospheric pressure. As a result, the manufacture cost of preparing a single crystal of $KTiOAsO_4$ may be lowered noticeably.

While the invention has been described in detail and with reference to specific embodiments thereof, it will be apparent to one skilled in the art that various changes and modifications can be made therein without departing from the spirit and scope thereof.

What is claimed is:

1. A process for preparing a single crystal of potassium titanium arsenate by flux growth method, wherein a compound of $K_2ZO_4$, in which Z represents at least one selected from the group consisting of W, S, Mo and Cr, is used as a flux and the said flux is blended with potassium titanium arsenate in such a way that the proportion of potassium titanium arsenate is from 15 to 50 mol % of the whole.

2. The process as claimed in claim 1, in which the potassium titanium arsenate to be employed is one obtained by blending $KAsO_3$ and $TiO_2$ in the same molar ratio and roasting them.

3. The process as claimed in claim 1, in which the potassium titanium arsenate to be employed is one obtained by blending $KH_2AsO_4$ and $TiO_2$ in the same molar ratio and roasting them.

* * * * *